(12) United States Patent
Anderson et al.

(10) Patent No.: US 6,768,189 B1
(45) Date of Patent: Jul. 27, 2004

(54) HIGH POWER CHIP SCALE PACKAGE

(75) Inventors: James Anderson, Huntington Beach, CA (US); Gershon Akerling, Culver City, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/454,081

(22) Filed: Jun. 4, 2003

(51) Int. Cl.[7] .............................................. H01L 23/02
(52) U.S. Cl. .................... 257/678; 174/262; 174/263; 174/264; 174/265; 174/266; 361/792; 361/793; 361/794; 361/795; 257/678; 257/684; 257/692; 257/758; 257/774; 257/775
(58) Field of Search .................. 174/262–266; 361/792–795; 257/678, 684, 692, 698, 758, 774, 775

(56) References Cited

U.S. PATENT DOCUMENTS

| | | | | |
|---|---|---|---|---|
| 5,436,412 A | * | 7/1995 | Ahmad et al. | 174/265 |
| 5,579,207 A | * | 11/1996 | Hayden et al. | 361/790 |
| 5,741,729 A | * | 4/1998 | Selna | 438/125 |
| 5,987,732 A | | 11/1999 | Lee et al. | |
| 6,097,265 A | | 8/2000 | Chan et al. | |
| 6,137,164 A | * | 10/2000 | Yew et al. | 257/686 |
| 6,194,669 B1 | | 2/2001 | Bjorndahl et al. | |
| 6,223,439 B1 | * | 5/2001 | Wonderley | 30/162 |
| 6,459,039 B1 | * | 10/2002 | Bezama et al. | 174/52.4 |
| 6,521,845 B1 | * | 2/2003 | Barrow | 174/260 |
| 6,632,372 B1 | * | 10/2003 | Chen et al. | 216/13 |

* cited by examiner

*Primary Examiner*—Jerome Jackson
*Assistant Examiner*—Edgardo Ortiz
(74) *Attorney, Agent, or Firm*—John M. Miller; Warn, Hoffmann, Miller & LaLone, P.C.

(57) ABSTRACT

A packaged die (112) for an integrated circuit (62) that eliminates the wire bonds required in the prior art, and provides integrated circuit packaging while the circuit (62) is still in a wafer format. A wafer substrate (64) on which the integrated circuits (62) have been fabricated is patterned and etched to form signal and ground vias (74, 72) through the substrate (64). A back-side ground plane (82) is deposited in contact with the ground vias (72). A protective layer (90) is formed on the top surface (76) of the substrate (64), and a protective layer (98) is formed on the bottom surface (84) of the substrate (64), where the bottom protective layer (98) fills in removed substrate material between the integrated circuits (62). Vias (106) are formed through the bottom protective layer (98), and the wafer substrate (64) is diced between the integrated circuits (62).

23 Claims, 4 Drawing Sheets

HIGH POWER CHIP SCALE PACKAGE

BACKGROUND OF THE INVENTION

1. Field of the Invention

This invention relates generally to a process for packaging integrated circuits and, more particularly, to a packaging process that eliminates lead frame structures and wire bonds, and allows testing while the integrated circuit is still in wafer format.

2. Discussion of the Related Art

As is well understood in the art, many integrated circuit chips are patterned and formed together on an integrated circuit wafer. The wafer may be 3–15 inches in diameter, and include hundreds or thousands of integrated circuit chips symmetrically disposed in a matrix configuration on the wafer depending on the circuit complexity. Once the integrated circuit chips are fabricated, the wafer is cut between the integrated circuit chips to separate the chips from the wafer. The chips are then tested for performance.

Once the integrated circuit chip is separated from the wafer, it is sometimes packaged in a packaging assembly that provides environmental protection and the like. Generally, the integrated circuit chip is mounted to a metallized ground plane to provide a ground reference and thermal coupling to remove heat from the integrated circuit chip. A lead frame is mounted to the assembly to provide power, signal and ground connections to other circuit elements outside of the package. Wire bonds are used to provide electrical connections between the lead frame and the chip, and between the lead frame and the ground plane. However, the wire bonds cause parasitic inductances and capacitances that compromise performance of the integrated circuit, especially at high frequencies.

FIG. 1 is a cross-sectional view of a packaging assembly 10 for packaging an integrated circuit chip 12 of the type discussed above. The integrated circuit chip 12 is mounted to a back-side ground plane 14 by a thermally and electrically conductive attachment layer 16, such as solder. The ground plane 14 is mounted to a die paddle 18 associated with a lead frame 20. The lead frame 20 includes a plurality of separate leads 24 that are electrically isolated from each other and from the die paddle 18. The leads 24 provide signal and power connections to the integrated circuit chip 12 from other circuit elements and systems. Metal traces 26 are deposited on top of the leads 24 within the packaging assembly 10 to provide a good electrical contact thereto. Signal wire bonds 28 are electrically connected to the traces 26 and to the chip 12 to make electrical connections thereto. Additionally, ground wire bonds 30 are electrically coupled to the ground plane 14 and the traces 26, or the ground plane 14 and the chip 12, as shown. A flowable solder layer 32 is deposited on the bottom surface of the leads 24 and the die paddle 18 to provide good electrical, mechanical and thermal coupling.

A moldable material, such as a plastic compound, is injection molded around the integrated circuit chip 12, the wire bonds 28 and 30 and the lead frame 20 to seal the components and provide a protective cover 36. The packaging assembly 10 is surface mounted to a circuit board (not shown) including other packaging assemblies to form an electrical system. The solder layer 32 is heated so that solder flows up the sides of the leads 24 to make good electrical connection to the circuit board.

The leads 24 of the lead frame 20 of the packaging assembly 10 shown in FIG. 1 extend beyond the sides of the protective cover 36. Thus, the size of the assembly 10 is larger than it needs to be. FIG. 2 is a cross-sectional view of another known packaging assembly 40 that is a variation of the packaging assembly 10 where like elements are identified by the same reference numeral. In this embodiment, the molding forming the cover 36 has been molded to form straight sides with the leads 24 so that when the solder flows up the side of the leads 24, it still makes electrical contact thereto.

SUMMARY OF THE INVENTION

In accordance with the teachings of the present invention, a packaging assembly for an integrated circuit is disclosed that eliminates the wire bonds required in the prior art, and provides integrated circuit packaging while the circuit is still in a wafer format. The wafer substrate on which the many integrated circuits have been fabricated is patterned and etched to form signal and power vias through the substrate around an outside periphery of each circuit, and to form ground vias through the substrate beneath the circuits. The combination of a portion of the wafer substrate, the vias and the integrated circuit define an integrated circuit die. Bonding pads are deposited on a top surface and a bottom surface of the wafer substrate that are electrically coupled to the signal vias. A back-side ground plane is provided in electrical contact with the ground vias.

A top protective layer is deposited over all of the integrated circuits, and a photoresist is deposited, patterned and etched on the bottom surface of the wafer substrate so that wafer substrate material can be removed between the dies. A bottom protective layer is then deposited on a bottom surface of the wafer substrate so that it fills the areas between the dies where the substrate material has been removed. The bottom protective layer is then patterned and etched to provide electrical vias therethrough in contact with the back-side metal layer and the signal pads to make electrical contact thereto outside of the packaging assembly. The wafer is then diced along edges of the dies so that the various vias on the sides of the dies are exposed to provide electrical signals to the circuit within the assembly.

Additional advantages and features of the present invention will become apparent from the following description and appended claims, taken in conjunction with the accompanying drawings.

DETAILED DESCRIPTION OF THE EMBODIMENTS

Figure 1:
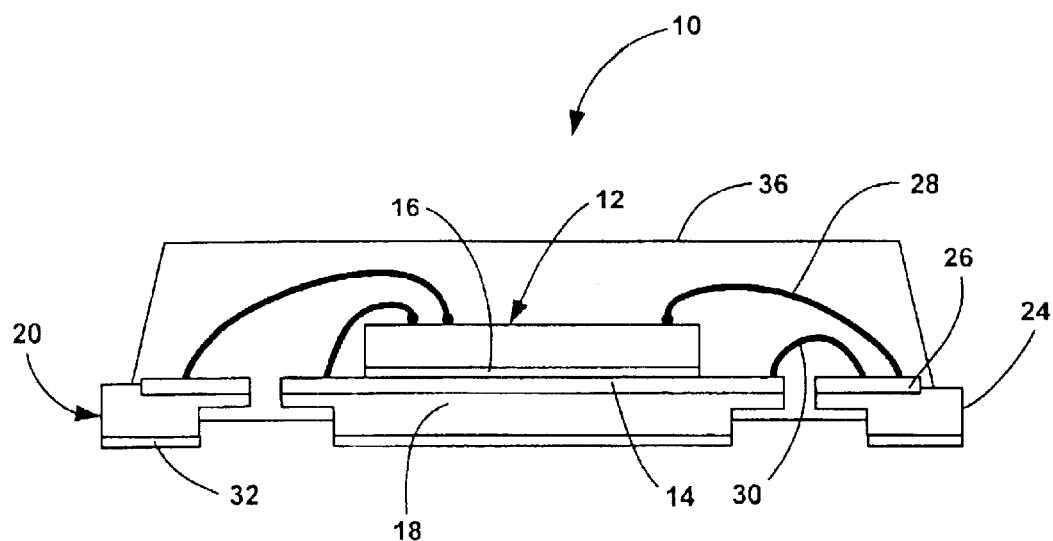
FIG. 1 is a cross-sectional view of a known packaging assembly for an integrated circuit.
Figure 2:
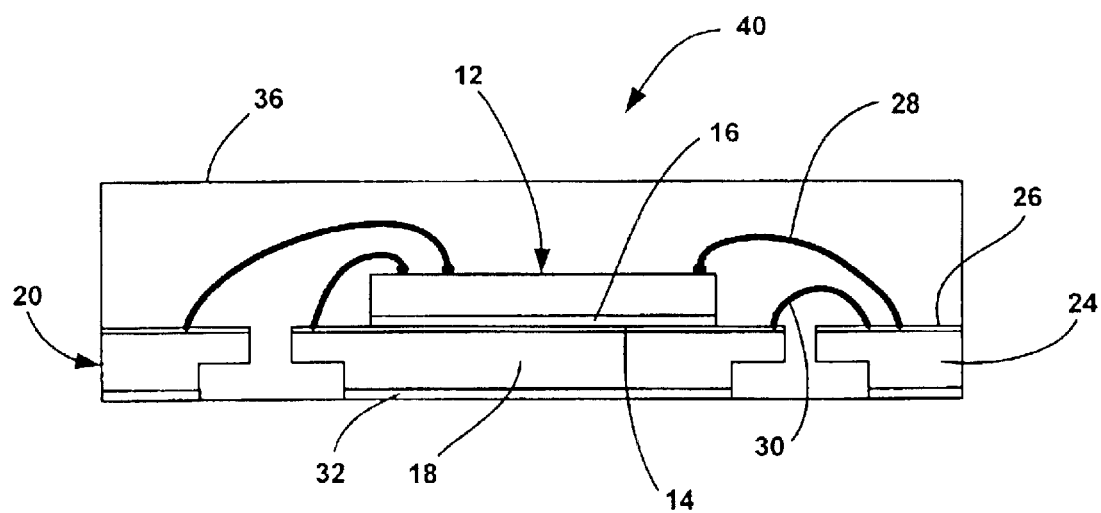
FIG. 2 is a cross-sectional view of another known packaging assembly for an integrated circuit.
Figure 3:
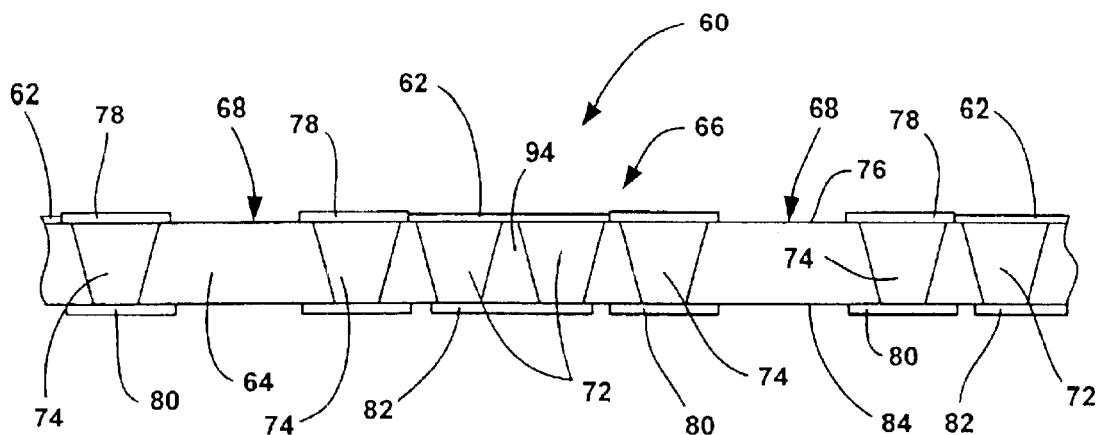
FIGS. 3–6 are cross-sectional views of a structural configuration showing a fabrication technique for packaging integrated circuits in a wafer format, according to the invention.

The following discussion of the embodiments of the invention directed to a process for packaging integrated circuits in a wafer format is merely exemplary in nature, and is in no way intended to limit the invention or its application or uses.

FIGS. 3–6 are cross-sectional views of an integrated circuit structure 60 that depicts processing steps for packaging integrated circuits 62, while the integrated circuits 62 are still part of the fabrication wafer, represented here as a semiconductor wafer substrate 64. The semiconductor substrate 64 can be any suitable semiconductor or substrate wafer material depending on the particular device, such as Si, InP, GaAs, etc., and will have the appropriate thickness, such as 50–1000 µm. Further, the wafer can be any suitable diameter, and the integrated circuits 62 can be any suitable electrical component, such as an amplifier, RAM, DAC, ADC, etc. The integrated circuits 62 are part of an integrated circuit die 66, where the many dies are separated by scribe lanes 68. Typical integrated circuit die sizes range from ½ mm² to 625 mm².

As will be discussed in more detail herein, electrical connections, including signal connections, power connections and ground connections, are made to other circuits outside of the packaging assembly by ground vias 72 and signal and power vias 74. The vias 72 and 74 are formed through the substrate 64 by patterning a photoresist layer (not shown) on the substrate 64, etching away the semiconductor material through the patterned photoresist layer where the via is to be located, and filling the formed hole in the substrate 64 with a suitable via metal, such as a copper alloy. As shown, the vias 72 and 74 are formed through a top surface 76 of the substrate 64 by any of several techniques known in the art including anisotropic etching.

A series of top-side bond pads 78 are patterned around the integrated circuits 62, and provide signal and power connections to the integrated circuits 62. Particularly, the various signal and power traces associated with the integrated circuits 62 are formed along an edge of the integrated circuits 62 so that the bond pads 78 can make electrical contact thereto. The bond pads 78 are electrically coupled to back-side bond pads 80 on a back-side 84 of the substrate 64 by the appropriate via 74, as shown. A back-side ground plane 82 is patterned on the back-side 84 of the substrate 64, and connections to the ground plane 82 from the integrated circuits 62 are made through the appropriate vias 72. The ground plane 82 has a suitable size and configuration to provide the appropriate thermal conductivity for heat sink purposes. As is apparent, the ground plane 82 is electrically isolated from the back-side pads 80. Thus, the die 66 is made up of the integrated circuit 62, the pads 78 and 80, a portion of the substrate 64 and the ground plane 82.

Figure 4:
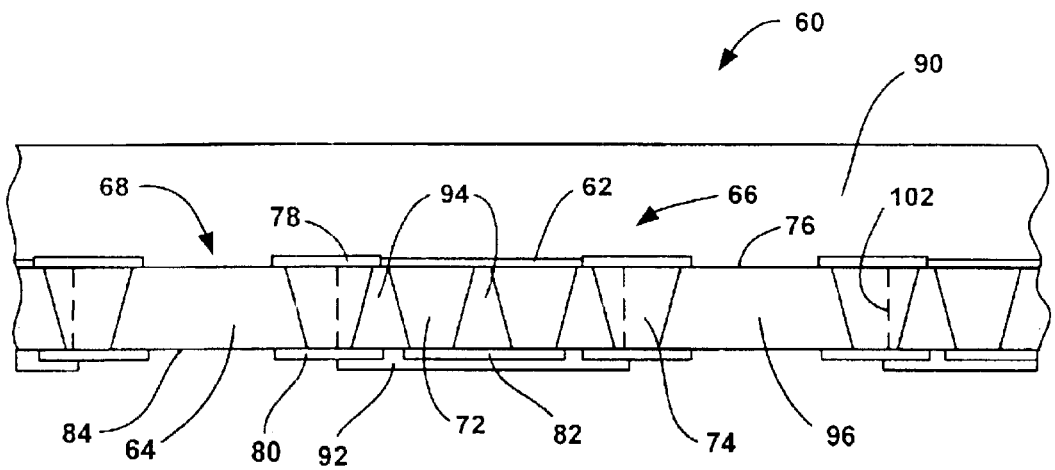

A suitable material is then deposited on top of the entire wafer to provide a top protective layer 90, as shown in FIG. 4. The protective layer 90 can be any suitable material, such as a plastic compound, and can be any suitable thickness, such as 150–200 µm. A photoresist layer 92 is deposited and patterned on a back-side of the structure 60 so that regions 96 of the substrate 64 in the scribe lanes 68 are exposed and regions 94 of the substrate 64 between the vias 72 and 74 within the die 66 are unexposed. A suitable etchant is then used to remove the substrate material in the regions 96 so that the original material that held the dies 66 together is removed. The various dies 66 in the wafer are still held together by the top protective layer 90. During the substrate etch, the etchant will move laterally inwards in the dies 66 between the signal vias 74 around its outer edge to a location represented by line 102.

Figure 5:
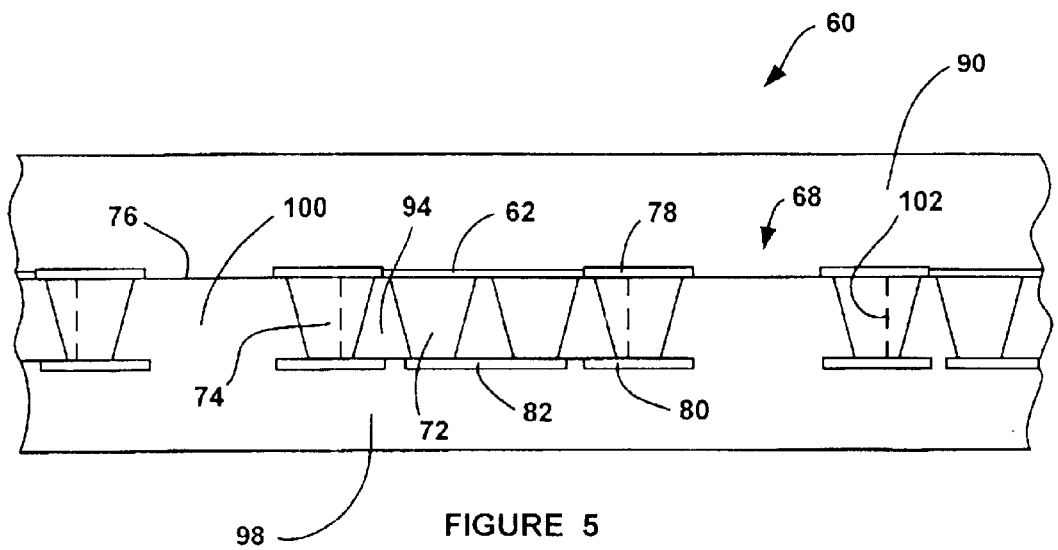

The photoresist layer 92 is then removed by a suitable etching process, and a bottom protective layer 98 is deposited on the back-side of the structure 60 so that it fills in regions 100 where the regions 96 of the substrate 64 have previously been removed, as shown in FIG. 5. Thus, the top layer 90 and the bottom layer 98 merge in the scribe lanes 68, as shown. The protective layer 98 can be made of the same material as the protective layer 90, or another suitable material. Also, in one embodiment, the protective layer 98 has a thickness about the same as the protective layer 90, such as 150–200 µm.

Figure 6:
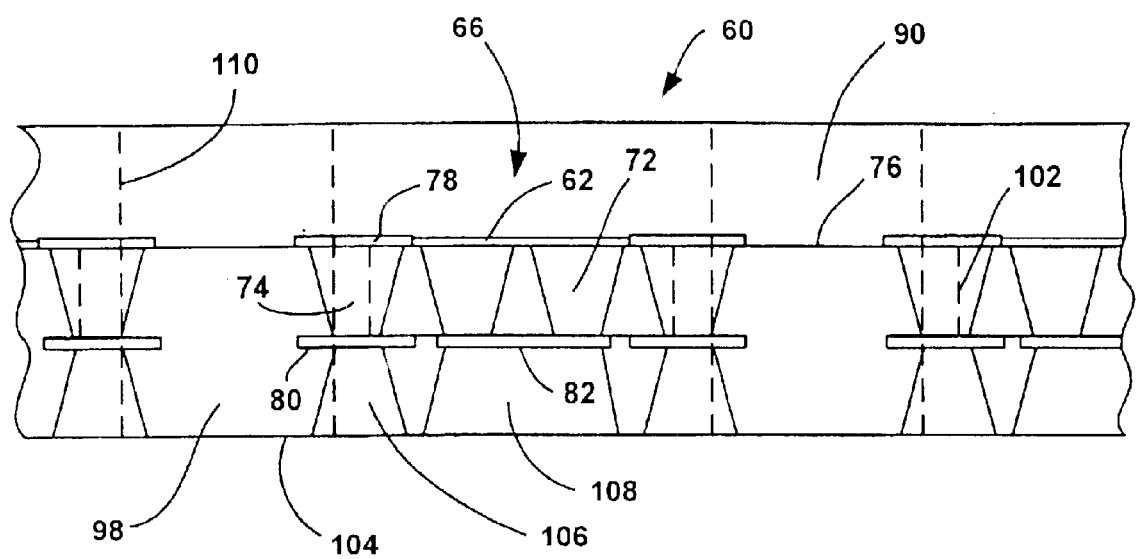

Next, a photoresist layer is deposited and patterned on a back-side surface 104 of the back protective layer 98. Openings in the photoresist layer are defined opposite to the bond pads 80 and the ground planes 82. The protective layer 98 is then etched through the openings in the photoresist layer so that openings in the protective layer 98 are provided to expose the pads 80 and the back-side ground plane 82, as shown in FIG. 6. The holes are filled with a via material to provide electrical signal and power vias 106 that contact the pads 80 and ground vias 108 that contact the ground planes 82. Therefore, the dies 66 are completely protected by the protective layers 90 and 98, and have electrical coupling to the integrated circuits 62 through the protective layer 98 by the vias 106 and 108.

While the dies 66 are still in the wafer format, they can be probed, tested and mapped. Once the dies 66 are tested, they are separated by cutting the structure 60 along lines 110 to separate the dies 66 into protected integrated circuit packaged assemblies. As is apparent, the signal and power vias 74 will be exposed to the outside environment of the packaged assembly, and the ground planes 82 are in electrical contact by the vias 108 at a bottom of the packaging assembly. Further, the die semiconductor material is protected by the protective layer 98.

Figure 7:
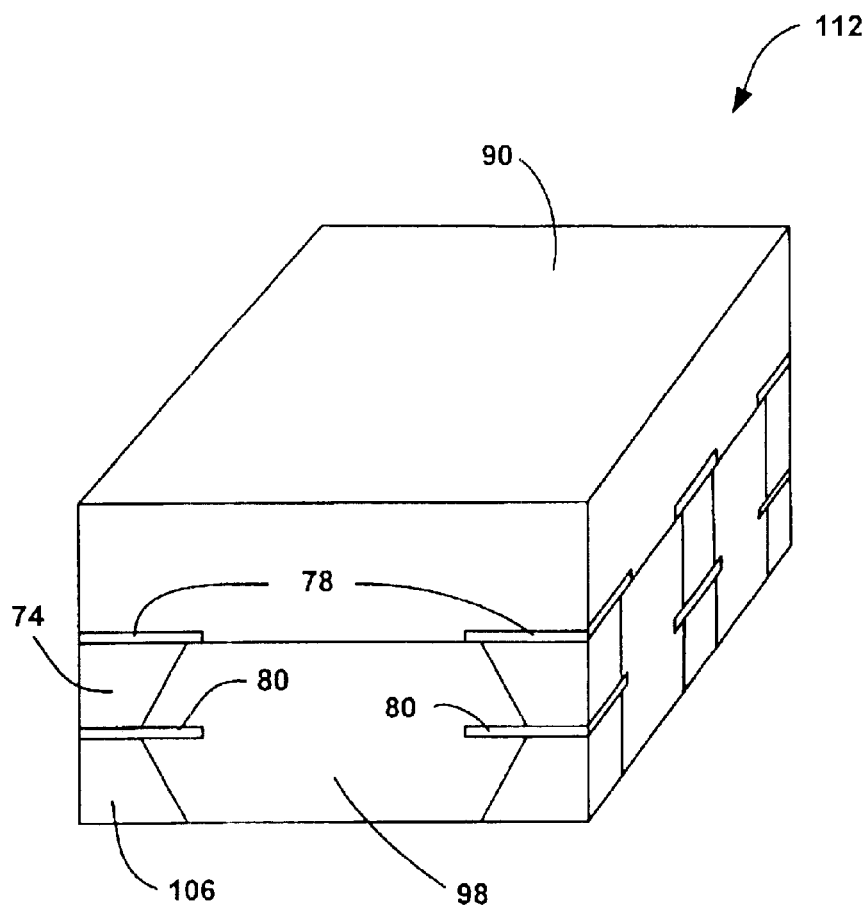
FIG. 7 is a perspective view of one of the integrated circuit packages shown in FIG. 6 separated from the wafer.

FIG. 7 is a perspective view of a packaged die 112 that is one of the separated dies 66 removed from the structure 60 along the cut lines 110, where like elements are represented by like reference numerals. As is apparent, electrical contact to the integrated circuit 62 can be provided by the various vias 106 and 74. The packaged die 112 can be surface mounted to an electrical circuit board, where solder is caused to flow up the sides of the vias 106 to make electrical contact as was done in the known packaging assemblies. In one embodiment, the complete thickness of the packaged die 112 can be as low as about 100–500 µm. This is substantially thinner than those packaging assemblies known in the art for the same size die.

Figure 8:
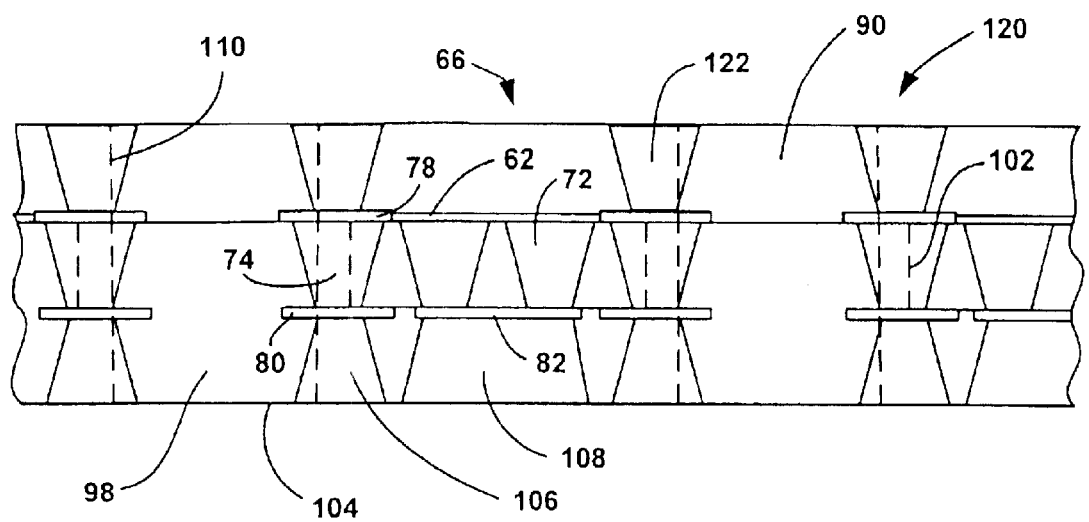
FIG. 8 is a cross-sectional view of a structural configuration showing a fabrication technique for packaging integrated circuits in a wafer format, according to another embodiment of the present invention.

The packaging fabrication technique discussed above can be extended to a packaging assembly where the dies 66 are stacked. FIG. 8 is a cross-sectional view of a wafer structure 120 depicting this embodiment, where like elements are identified with the same reference numerals used above. In order to provide electrical connections to the integrated circuits 62 from the top, the protective layer 90 is patterned and etched using a photoresist and etchant to form holes through the layer 90 to expose the signal pads 78 below. The openings are then filled with a via material to form vias 122 that make electrical contact with the signal pads 78. A top surface of the vias 122 provide packaged pin connection locations, and can also be used to test the integrated circuits 62 while they are still in the wafer format. The structure 120 is then diced along the cut lines 110, as discussed above, to provide separate packaged dies. In this embodiment, the packaged dies can be surface mounted either right side up or up-side down, and still provide the electrical connections and ground connections to the integrated circuit 62.

Figure 9:
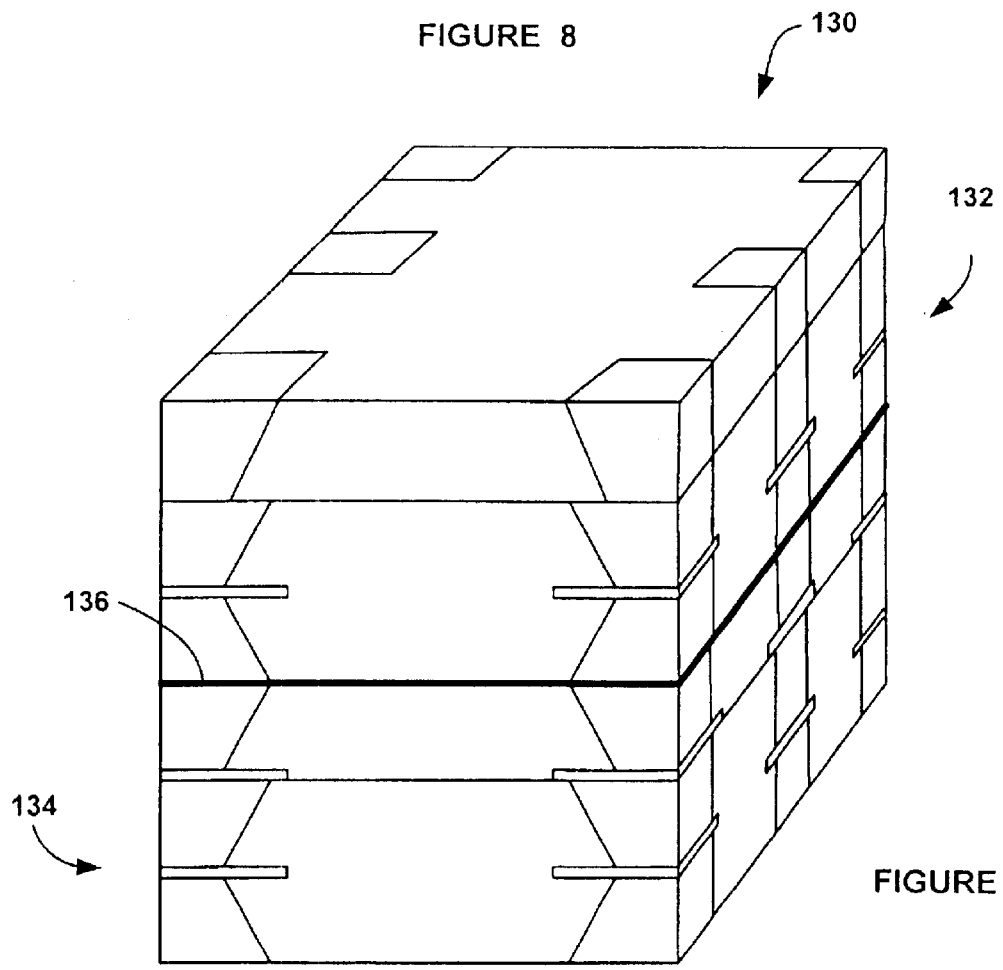
FIG. 9 is a perspective view of two of the circuit packages shown in FIG. 8 separated from the wafer and stacked together.

The vias 122 allow the packaged dies to be stacked on top of each other to further conserve space. FIG. 9 is a perspective view of a packaging assembly 130 that includes a top packaged die 132 mounted to a bottom packaged die 134 by a solder reflow bond 136. As is apparent, both of the packaged dies 132 and 134 are packaged dies stacked from the structure 120 on top of each other. As is apparent, the proper electrical connections are made through the packaging assembly 130 to provide electrical connections to the integrated circuits 62. The invention is not limited to two stacked packaged dies, but can be extended to any reasonable number of stacked dies.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An integrated circuit packaging assembly comprising:
    a substrate including a top surface and a bottom surface;
    an integrated circuit mounted to the top surface of the substrate;
    a plurality of top-side bond pads deposited on the top surface of the substrate around a perimeter of the integrated circuit, said top-side bond pads being in direct electrical contact with the integrated circuit;
    a plurality of back-side bond pads deposited on the bottom surface of the substrate;
    a plurality of signal vias extending through the substrate and being in electrical contact with a top-side pad and a bottom-side pad;
    a top protective layer formed over the top-side pads and the integrated circuit;
    a bottom protective layer formed over the bottom surface of the substrate; and
    a plurality of signal vias extending through the bottom protective layer and being in electrical contact with the back-side pads.

2. The packaging assembly according to claim 1 further comprising a plurality of ground vias extending through the substrate and being in electrical contact with a metal layer disposed on a bottom surface of the integrated circuit.

3. The packaging assembly according to claim 2 further comprising a ground plane disposed on the bottom surface of the substrate and being in electrical contact with the ground vias.

4. The packaging assembly according to claim 3 further comprising a plurality of ground vias extending through the bottom protective layer and being in electrical contact with the ground plane.

5. The packaging assembly according to claim 1 further comprising a plurality of signal vias formed through the top protective layer and being in electrical contact with the top-side pads.

6. The packaging assembly according to claim 5 further comprising another integrated circuit mounted to another substrate, said another integrated circuit being electrically coupled to the plurality of signal vias formed through the top protective layer by signal vias extending through the another substrate.

7. The packaging assembly according to claim 1 wherein a side of each of the plurality of top-side bond pads is exposed outside of the top protective layer.

8. The packaging assembly according to claim 1 wherein a side of each of the plurality of signal vias extending through the substrate is exposed outside of the substrate.

9. The packaging assembly according to claim 1 wherein a side of each of the plurality of back-side bond pads is exposed outside of the bottom protected layer.

10. The packaging assembly according to claim 1 wherein a side of each of the plurality of signal vias extending through the bottom protective layer is exposed outside of the bottom protective layer.

11. The packaging assembly according to claim 1 wherein a portion of the bottom protective layer is formed between the plurality of signal vias extending through the substrate adjacent to a side of the substrate.

12. The packaging assembly according to claim 1 wherein the top protective layer and the bottom protective layer are plastic layers.

13. An integrated circuit packaging assembly comprising:
    a first substrate including a top surface and a bottom surface;
    a first integrated circuit mounted to the top surface of the first substrate;
    a plurality of top-side bond pads deposited on the top surface of the first substrate around the perimeter of the first integrated circuit, said plurality of top-side bond pads being in electrical contact with the first integrated circuit;
    a plurality of back-side bond pads deposited on the bottom surface of the first substrate;
    a plurality of signal vias extending through the first substrate and being in electrical contact with a top-side pad and a bottom-side pad, wherein a side of each of the plurality of signal vias extending through the first substrate is exposed outside of the first substrate;
    at least one ground via extending through the first substrate;
    a ground plane disposed on the bottom surface of the first substrate and being in electrical contact with the at least one ground via extending through the first substrate;
    a top protective layer formed over the top-side pads and the first integrated circuit, wherein a side of each of the top-side pads is exposed outside of the top protective layer;
    a bottom protective layer formed over the bottom surface of the first substrate, wherein a side of each of the back-side bond pads is exposed outside of the bottom protective layer;
    a plurality of signal vias extending through the bottom protective layer and being in electrical contact with the back-side bond pads, wherein a side of each of the plurality of signal vias extending through the bottom protective layer is exposed outside of the bottom protective layer; and
    at least one ground via extending through the bottom protective layer and being in electrical contact with the ground plane.

14. The packaging assembly according to claim 13 wherein a portion of the bottom protective layer is formed between the plurality of signal vias extending through the first substrate adjacent to a side of the first substrate.

15. The packaging assembly according to claim 13 further comprising a plurality of signal vias formed through the top protective layer and being in electrical contact with the top-side pads.

16. The packaging assembly according to claim 15 further comprising a second integrated circuit mounted to a second substrate, said second integrated circuit being electrically coupled to the plurality of signal vias formed through the top protective layer by signal vias extending through the second substrate.

17. The packaging assembly according to claim 13 wherein the top protective layer and the bottom protective layer are plastic layers.

18. An integrated circuit packaging assembly comprising:
- a first substrate including a top surface and a bottom surface;
- a first integrated circuit mounted to the top surface of the first substrate;
- a plurality of top-side bond pads deposited on the top surface of the first substrate around a perimeter of the first integrated circuit, said top-side bond pads being in direct electrical contact with the first integrated circuit;
- a plurality of back-side bond pads deposited on the bottom surface of the first substrate;
- a plurality of signal vias extending through the first substrate and being in electrical contact with a top-side pad and a bottom-side pad, wherein a side of each of the plurality of signal vias extending through the first substrate is exposed outside of the first substrate; and
- a top protective layer formed over the top-side pads and the integrated circuit, wherein a side of each of the plurality of top-side pads is exposed outside of the top protective layer.

19. The packaging assembly according to claim 18 further comprising a plurality of ground vias extending through the first substrate and being in electrical contact with a metal layer disposed on a bottom surface of the first integrated circuit.

20. The packaging assembly according to claim 19 further comprising a ground plane disposed on the bottom surface of the first substrate and being in electrical contact with the ground vias.

21. The packaging assembly according to claim 18 further comprising a bottom protective layer formed over the bottom surface of the first substrate and a plurality of signal vias extending through the bottom protective layer and being in electrical contact with the back-side pads, wherein a side of each of the back-side bond pads is exposed outside of the bottom protective layer and a side of each of the plurality of signal vias extending through the bottom protective layer is exposed outside of the bottom protective layer.

22. The packaging assembly according to claim 21 wherein a portion of the bottom protective layer is formed between the plurality of signal vias extending through the first substrate adjacent to a side of the first substrate.

23. The packaging assembly according to claim 18 further comprising a plurality of signal vias formed through the top protective layer and being in electrical contact with the top-side pads, said packaging assembly further comprising a second integrated circuit mounted to a second substrate, said second integrated circuit being electrically coupled to the plurality of signal vias formed through the top protective layer by signal vias extending through the second substrate.

* * * * *